United States Patent
Braun et al.

[11] Patent Number: 6,091,625
[45] Date of Patent: Jul. 18, 2000

[54] FERROELECTRIC MEMORY AND METHOD FOR PREVENTING AGING IN A MEMORY CELL

[75] Inventors: Georg Braun; Carlos Mazure-Espejo, both of München; Heinz Hönigschmid, Starnberg; Andrej Majdic, Zorneding, all of Germany

[73] Assignee: Siemens Aktiengesellschaft, Munich, Germany

[21] Appl. No.: 09/408,479

[22] Filed: Sep. 28, 1999

[30] Foreign Application Priority Data

Sep. 28, 1998 [DE] Germany .................. 198 44 402

[51] Int. Cl.[7] .................................................. G11C 11/22
[52] U.S. Cl. ...................... 365/145; 365/149; 365/190; 365/207; 365/222
[58] Field of Search ................... 365/145, 207, 365/190, 149, 222

[56] References Cited

U.S. PATENT DOCUMENTS 5,270,967  12/1993  Moazzami et al. .................. 365/145

FOREIGN PATENT DOCUMENTS

0090245488AA  9/1997  Japan .................. G11C 14/00

*Primary Examiner*—Andrew Q. Tran
*Attorney, Agent, or Firm*—Herbert L. Lerner; Laurence A. Greenberg; Werner H. Stemer

[57] ABSTRACT

An integrated memory includes a cell array having bit lines, word lines and writable memory cells. A first differential sense amplifier has connections connected to a data line pair through which the first sense amplifier reads information from one of the memory cells during a read access operation in order to amplify it subsequently, and through which the first sense amplifier writes information to one of the memory cells during a write access operation. The relevant information is transferred as differential signals through the data line pair and is temporarily stored by the first sense amplifier during every write access operation. The memory also has a switching unit through which the data line pair is connected to the connections of the first sense amplifier, for interchanging the lines of the data line pair in relation to the connections of the first sense amplifier, depending on the switching state of the switching unit. The switching state of the switching unit is changed at least once during a write access operation, so that the information to be written is written to the relevant memory cell by the first sense amplifier initially in noninverted form and then in inverted form. A method for preventing aging in a memory cell in an integrated memory is also provided.

8 Claims, 3 Drawing Sheets

FERROELECTRIC MEMORY AND METHOD FOR PREVENTING AGING IN A MEMORY CELL

BACKGROUND OF THE INVENTION

Field of the Invention

The invention relates to an integrated memory having writable memory cells. The invention also relates to a method for preventing aging in a memory cell in an integrated memory.

Ferroelectric memories, such as FRAMs or FeRAMs, are writable integrated memories with memory cells which have at least one ferroelectric capacitor as a storage element. That capacitor has a ferroelectric material as a dielectric. That material can be polarized in different ways, corresponding to the storage of different information. The ferroelectric material retains its polarization even when the memory is disconnected from a supply voltage. Therefore, FRAMs are writable, nonvolatile memories. However, ferroelectric memory cells are associated with aging phenomena which result in it not being readily possible to store new information. Thus, for example, the memory cells tend to retain an already programmed state (a so-called "imprint").

U.S. Pat. No. 5,270,967 relates to preventing aging in ferroelectric memory cells by refreshing their ferroelectric capacitors. Refreshing involves applying voltages to the storage capacitor which are higher than those arising during normal operation. During refreshing, those higher voltages are applied to the storage capacitor with alternating signs. The imprint can be reduced by using the method described. In that case, the memory cells are refreshed whenever a particular number of write access operations to the memory cells have been performed.

In U.S. Pat. No. 5,270,967, before a memory cell is refreshed, its content is temporarily stored in a sense amplifier which is subsequently isolated from the memory cell by a switch. A special circuit unit then produces the alternating voltages required for refreshing. At the end of refreshing, the switch is closed and the information temporarily stored in the sense amplifier can be written to the memory cell again to produce the previous state.

A disadvantage of the procedure described above is that the provision of the additional circuit unit, which produces the higher voltages necessary for refreshing, entails a relatively large space requirement.

SUMMARY OF THE INVENTION

It is accordingly an object of the invention to provide an integrated memory and a method for preventing aging in a memory cell in an integrated memory, which overcome the hereinafore-mentioned disadvantages of the heretofore-known devices and methods of this general type and in which the memory cells are refreshed with lower hardware complexity.

With the foregoing and other objects in view there is provided, in accordance with the invention, an integrated memory, comprising a cell array having bit lines and word lines; writable memory cells disposed in the cell array; a data line pair; a first differential sense amplifier having connections connected to the data line pair, the first differential sense amplifier reading information from one of the memory cells over the data line pair during a read access operation in order to amplify the information subsequently, and the first sense amplifier writing information to one of the memory cells over the data line pair during a write access operation, the data line pair transferring the relevant information as differential signals, and the first sense amplifier temporarily storing the information during every write access operation; a switching unit having a switching state, the switching unit connecting the data line pair to the connections of the first sense amplifier, for interchanging lines of the data line pair in relation to the connections of the first sense amplifier depending on the switching state of the switching unit; and the switching state of the switching unit changing at least once during a write access operation, so that the information to be written is written to a relevant one of the memory cells by the first sense amplifier initially in noninverted form and then in inverted form.

Therefore, in the memory according to the invention, the first sense amplifier is not used merely for temporarily storing the information stored in the memory cell before refreshing and for writing that information back to the memory cell when refreshing has finished, as is the case in U.S. Pat. No. 5,270,967. The first sense amplifier is also used, during refreshing, to supply alternating voltages allocated to different logic states to the memory cell, so that no additional circuit units are necessary therefor. As is known, differential sense amplifiers in integrated memories ensure that the potentials on the data line pair connected to them are complementary with respect to one another. In other words, during a write or read access operation, one of the lines in the line pair is at a high level, corresponding to a logic "1", for example, and the other line is at a low level, corresponding to a logic "0", for example. According to the invention, by interchanging the allocation of the lines in the data line pair in relation to the connections of the first sense amplifier during the write access operation, the potential on each of the two lines thus changes constantly between the high and the low level. In this manner, the sense amplifier ensures that alternating voltages are present on the memory cell. This reduces the imprint in the memory cell.

It is advantageous if the number of changes in the switching state of the switching unit during a write access operation is even. Then, at the end of the write access operation, the information is stored in the memory cell with its original logic state.

The switching unit can be switched, for example, during each write access operation to the memory cells in the memory. Then, aging in the memory cell is prevented automatically with each write access operation. However, that increases the amount of time required for a write access operation.

Therefore, in accordance with another feature of the invention, the memory has a first operating mode, in which the switching state of the switching unit does not change during a write access operation, and a second operating mode, in which the switching state of the switching unit changes at least once during a write access operation. In the first operating mode, the write access operation is then relatively fast, whereas the write access operation in the second operating mode takes longer.

The write access operations during which the switching state of the switching unit changes can be either normal write access operations, in the case of which external data is supplied to the memory and is stored in the memory cell, or special write access operations, in the case of which the information stored in the memory cell to be refreshed is read, temporarily stored in the first sense amplifier and subsequently written back to the memory cell a plurality of times at alternating potentials beforehand. In this case, in order to have the original information in the memory cell after refreshing as beforehand, the number of changes in the switching states must again be even after the cell has been read.

In accordance with a further feature of the invention, the first sense amplifier is a primary sense amplifier, and the data line pair is a bit line pair in the memory, to which the primary sense amplifier is connected directly. In this embodiment, a switching unit is then required for each bit line pair.

In accordance with an added feature of the invention, the first sense amplifier is a secondary sense amplifier, and the memory has at least two second sense amplifiers which are primary sense amplifiers and are connected, firstly, through at least one respective pair of the bit lines to the memory cells and, secondly, through the data line pair to the first sense amplifier. In writable integrated memories such as DRAMs or FRAMs, a plurality of primary sense amplifiers are usually connected through a data line pair to a respective secondary sense amplifier which is used for further amplification of signals read from the memory cells. In this embodiment, only one respective circuit unit is required per data line pair connected to the secondary sense amplifier, so that the number of switching units is less than in the embodiment explained above.

In accordance with an additional feature of the invention, the memory cells have a storage capability decreasing as a function of a number of write and/or read access operations being performed, the first operating mode is a normal operating mode and the second operating mode is an operating mode preventing aging.

In accordance with yet another feature of the invention, the memory cells are ferroelectric memory cells.

In accordance with yet a further feature, the invention is preferably, but not exclusively, suitable for preventing aging in memory cells in a ferroelectric memory which have at least one ferroelectric storage capacitor. In that case, a voltage drop across the storage capacitor in the respective memory cell during a write access operation to that cell is higher in the second operating mode than in the first operating mode. The higher voltage across the storage capacitor can be achieved, for example, by supplying a first or second sense amplifier, connected to the bit line pair, with a higher supply voltage in the second operating mode than in the first operating mode. The sense amplifier then supplies the bit line pair with differential signals at a higher voltage during writing in the second operating mode. When data is written to a memory cell, that electrode of its storage capacitor which is connected to the bit line is then at a higher potential than in the first operating mode. The higher supply voltage for the sense amplifier thus produces a higher voltage across the storage capacitor in the memory cell. However, as an alternative or in addition to increasing the supply voltage for the sense amplifier, it is also possible to bring one electrode, remote from the bit line, of the storage capacitor in the memory cell, to different levels in the second operating mode than in the first operating mode. This also enables the voltage across the storage capacitor to be increased in the second operating mode. In this case, the potential on the relevant capacitor electrode can be constant or pulsed.

With the objects of the invention in view, there is also provided a method for preventing aging in a memory cell of an integrated memory, which comprises reading and temporarily storing information stored in the memory cell in the first sense amplifier; writing the information temporarily stored in the sense amplifier back to the memory cell at least twice; and changing the switching state of the switching unit after each time the information is written back.

Other features which are considered as characteristic for the invention are set forth in the appended claims.

Although the invention is illustrated and described herein as embodied in an integrated memory and a method for preventing aging in a memory cell in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
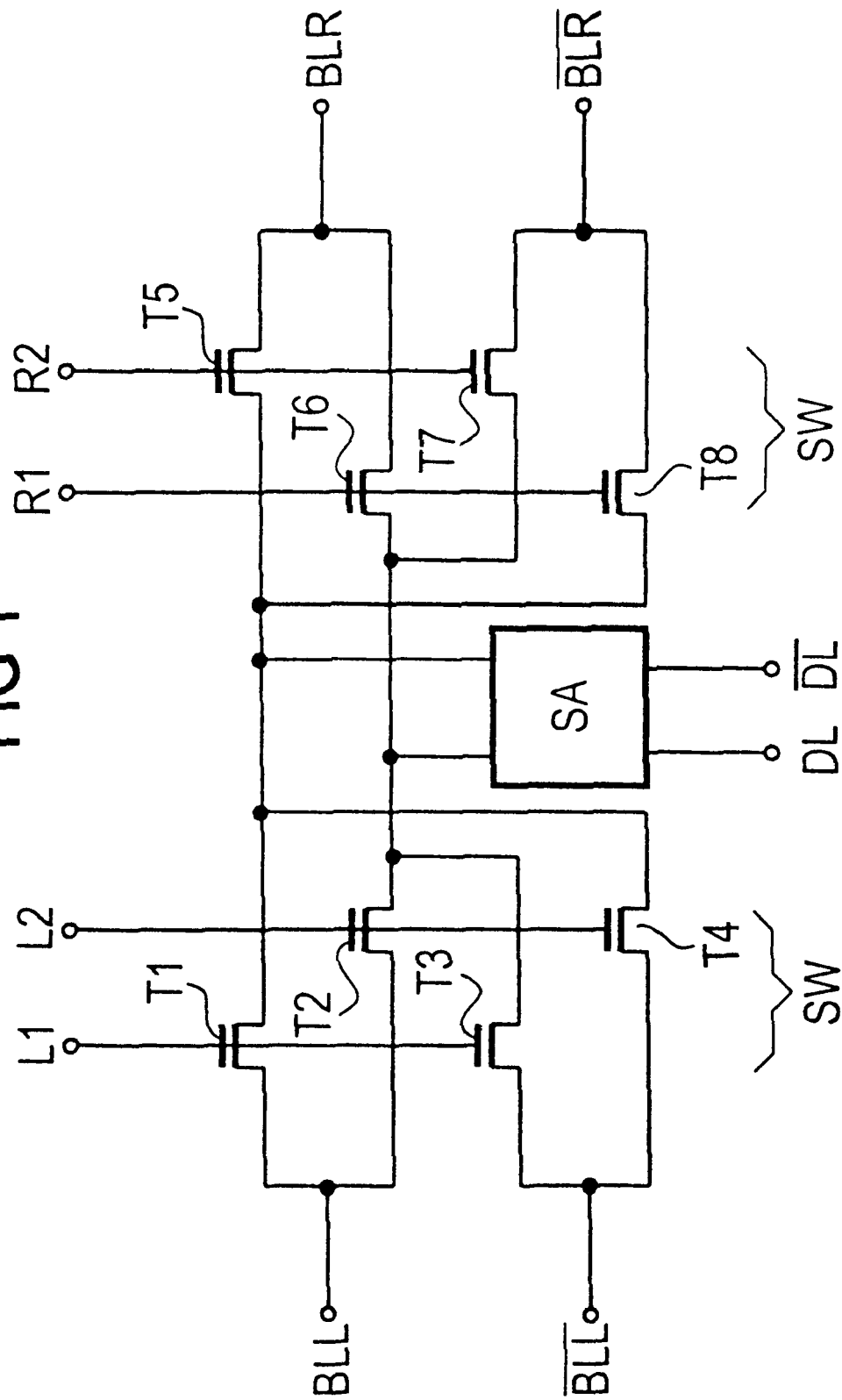
FIG. 1 is a schematic and block circuit diagram of a first exemplary embodiment of an integrated memory.
Figure 3:
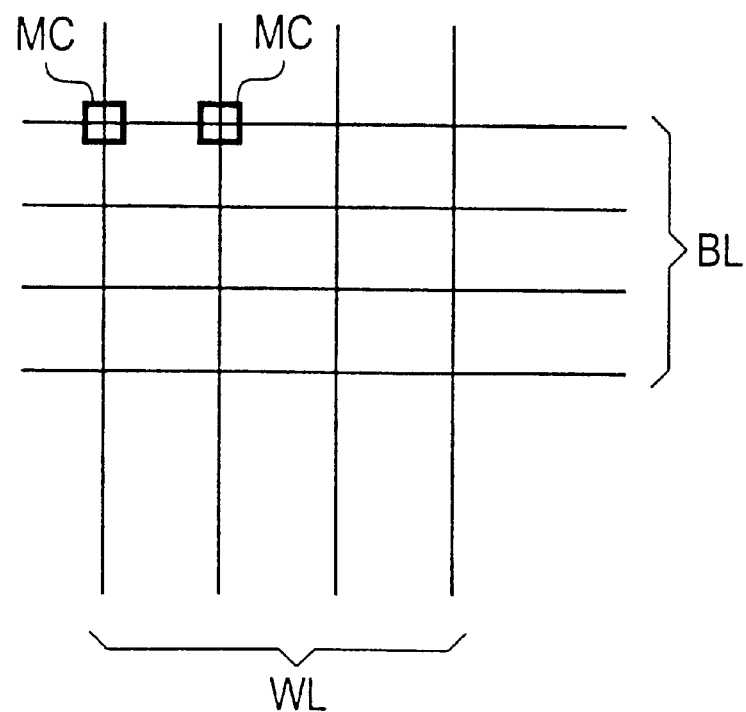
FIG. 3 is a block circuit diagram of a memory cell array in the memory.

Referring now to the figures of the drawings in detail and first, particularly, to FIG. 1 thereof, there is seen a first exemplary embodiment of an integrated memory according to the invention, of which only those components necessary for an understand of the invention have been shown. The exemplary embodiment considered herein is a ferroelectric memory which, as is shown in FIG. 3, has bit lines BL and word lines WL that are disposed in matrix form and have memory cells MC disposed at their intersections.

Figure 4:
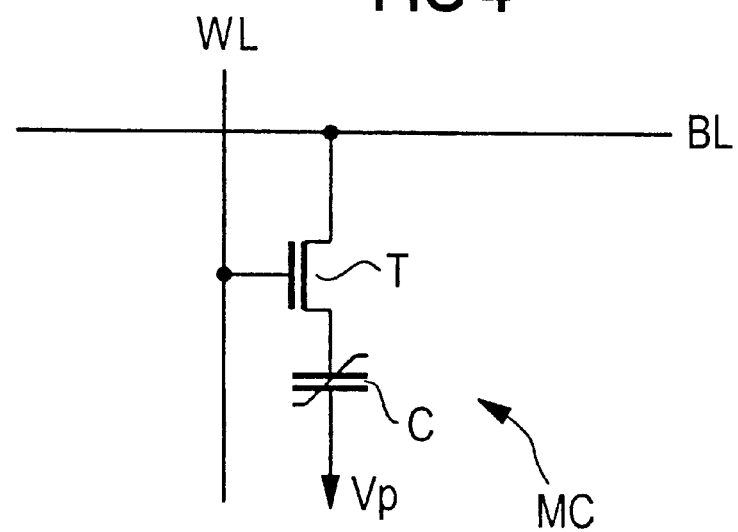
FIG. 4 is a schematic circuit diagram of a memory cell in the memory.

Each of the ferroelectric memory cells MC is constructed as shown in FIG. 4. These cells are memory cells of the 1-transistor/ 1-capacitor type which can be selected through one of the word lines WL, to which information can be written through one of the bit lines BL and from which stored information can be read through the bit lines BL. A bit line BL is connected through a primary current path of a memory cell transistor T to a first electrode of a ferroelectric storage capacitor C. A second electrode of this capacitor is connected to a plate potential $V_P$. A gate of the memory cell transistor is connected to one of the word lines WL. The plate potential $V_P$ is either permanently at a mean value situated between two supply potentials for the memory (for example $V_{CC}/2$), or the plate potential $V_P$ pulses with each write or read access operation to the memory cell MC, depending on the type of memory cell MC.

As is shown in FIG. 1, information is transferred from and to the memory cells, as is usual in DRAMs and FRAMs, as differential signals through bit line pairs BLL, $\overline{BLL}$; BLR, $\overline{BLR}$. Each two bit line pairs are allocated a differential primary sense amplifier SA which serves to amplify a differential signal produced on one of the bit line pairs, during a read access operation. The primary sense amplifier SA passes on the amplified differential signal to a data line pair DL, $\overline{DL}$. During a write access operation, information to be written is transferred in the opposite direction from the data lines DL, $\overline{DL}$, the sense amplifier SA and one of the bit line pairs BLL, $\overline{\text{BLL}}$ to the appropriate memory cell. The data line pair may also be considered to include the lines BLL, $\overline{\text{BLL}}$ and DL, $\overline{\text{DL}}$.

During an access operation to one of the memory cells MC, the word line WL and the bit line BL which are allocated to it are addressed through the use of appropriate addresses which can be applied to the memory. Before reading takes place, the two lines in the bit line pair BLL, $\overline{\text{BLL}}$ are precharged to the same potential. During a read access operation, the information in the memory cell is read out onto the noninverted bit line BLL, while the inverted bit line $\overline{\text{BLL}}$ is at a defined potential with which the primary sense amplifier SA compares the potential on the noninverted bit line BLL. If, on one hand, after the memory cell MC has been read, the potential on the noninverted bit line BLL is higher than on the inverted bit line $\overline{\text{BLL}}$, the differential primary sense amplifier SA amplifies this potential difference and produces a high level ($V_{CC}$) on the noninverted bit line BLL. If, on the other hand, after the memory cell MC has been read, the potential on the noninverted bit line BLL is lower than on the inverted bit line $\overline{\text{BLL}}$, the primary sense amplifier amplifies the signal on the noninverted bit line BLL to a low level (ground). The primary sense amplifier SA produces a logic state on the inverted bit line $\overline{\text{BLL}}$ which in each case is the inverse of the potential on the noninverted bit line BLL. The principle just described is known to a person skilled in the art of DRAMs and FRAMs and is therefore not explained in any further detail at this juncture.

The primary sense amplifier SA in FIG. 1 has two connections which are allocated, on one hand, to a left-hand bit line pair BLL, $\overline{\text{BLL}}$ and, on the other hand, to a right-hand bit line pair BLR, $\overline{\text{BLR}}$, that are associated with various cell arrays (shared sense amplifier concept). A first connection of the primary sense amplifier is connected to the noninverted left-hand bit line BLL through a first transistor T1, and a second connection of the sense amplifier is connected to the noninverted left-hand bit line BLL through a second transistor T2. The second connection is also connected to the inverted left-hand bit line $\overline{\text{BLL}}$ through a third transistor T3, and the first connection is connected to the inverted left-hand bit line $\overline{\text{BLL}}$ through a fourth transistor T4. In addition, the first connection is connected to the noninverted right-hand bit line BLR through a fifth transistor T5, and the second connection is connected to the noninverted right-hand bit line BLR through a sixth transistor T6. The second connection is connected to the inverted right-hand bit line $\overline{\text{BLR}}$ through a seventh transistor T7, and the first connection is connected to the inverted right-hand bit line $\overline{\text{BLR}}$ through an eighth transistor T8. In this exemplary embodiment, the primary sense amplifier SA is allocated to two memory cell arrays, namely a left-hand array and a right-hand array. Appropriately driving the eight transistors causes its connections to be connected either to the left-hand bit line pair BLL, $\overline{\text{BLL}}$, which is situated in the left-hand memory cell array, or to the right-hand bit line pair BLR, $\overline{\text{BLR}}$, which is situated in the right-hand memory cell array.

The eight transistors T1 to T8 in FIG. 1 are of the n-channel type. The gates of the first transistor T1 and the third transistor T3 are connected to a first control line L1. The gates of the second transistor T2 and the fourth transistor T4 are connected to a second control line L2. The gates of the sixth transistor T6 and the eighth transistor T8 are connected to a third control line R1. The gates of the fifth transistor T5 and the seventh transistor T7 are connected to a fourth control line R2.

The first four transistors T1 to T4 form a first switching unit SW, and the second four transistors T5 to T8 form a second switching unit SW. The transistors in each switching unit SW are used to interchange the allocation of the lines in the respective bit line pair BLL, $\overline{\text{BLL}}$ to the connections of the primary sense amplifier SA. The control lines L1, L2 and R1, R2 which are allocated to the respective switching unit SW therefore have three different states. There is either a low potential on the two control lines L1, L2, so that all of the associated transistors T1 to T4 are turned off or, in addition, either the first or the second control line can be at a high level.

If the two control lines L1, L2 are at a low level, then the primary sense amplifier SA is isolated from this bit line pair BLL, $\overline{\text{BLL}}$. It can then, for example, transfer data from or to the right-hand bit line pair BLR, $\overline{\text{BLR}}$ if the third control line R1 or the fourth control line R2 is driven accordingly.

In a first operating mode of the memory, the potential on the first control line L1 during a write or read access operation to a memory cell connected to the left-hand bit line pair BLL, $\overline{\text{BLL}}$ is always high, while the potential on the second control line L2 is always low. Allocation of the connections of the primary sense amplifier SA to the two lines in the bit line pair BLL, $\overline{\text{BLL}}$ remains constant in the first operating mode.

The memory also has a second operating mode, in which the potential on the first control line L1 and on the second control line L2 is constantly changing, so that firstly the first transistor T1 and the third transistor T3 are turned on and the second transistor T2 and the fourth transistor T4 are turned off. Then the second transistor T2 and the fourth transistor T4 are turned on and the first transistor T1 and the third transistor T3 are turned off. This change occurs in the second operating mode during a write access operation to one of the memory cells MC of the appropriate bit line pair. In this exemplary embodiment, the write access operation in the second operating mode is preceded by a read access operation to the appropriate memory cell MC. In this case, the information stored in the memory cell is transferred through the bit line pair BLL, $\overline{\text{BLL}}$ to the primary sense amplifier SA and is temporarily stored there. The primary sense amplifier SA in this case is of the usual construction for DRAMs or FRAMs. One embodiment of the primary sense amplifier SA is, for example, illustrated in U.S. Pat. No. 5,270,967 mentioned above. The sense amplifier SA amplifies the information read from the memory cell MC, so that opposite supply potential levels for the memory are subsequently present on the bit line pair BLL, $\overline{\text{BLL}}$. During this read access operation, the first control line L1 is at a high potential and the second control line L2 is at a low potential. After the information which is read in this way has been temporarily stored in the primary sense amplifier SA, the potentials on the two control lines L1, L2 are constantly interchanged, so that the differential signal at the connections of the sense amplifier SA is always transferred to the bit line pair BLL, $\overline{\text{BLL}}$ with the sign reversed in each case. This ensures that constantly alternating voltages are present on the respectively selected memory cell MC.

Since the primary sense amplifier SA in FIG. 1 temporarily stores the information previously read from the memory cell, in the second operating mode, this information is written back to the memory cell MC either in inverted or in noninverted form, depending on the switching state of the switching unit SW.

While one of the memory cells MC is being refreshed through the left-hand bit line pair BLL, $\overline{\text{BLL}}$ in FIG. 1, the third and the fourth control lines R1, R2 are at a low potential, so that the right-hand bit line pair BLR, $\overline{\text{BLR}}$ is decoupled from the primary sense amplifier SA. An access operation to the right-hand bit line pair proceeds in a similar manner by decoupling the left-hand bit line pair BLL, $\overline{BLL}$ as a result of the first two control lines L1, L2 being at a low potential. The four control lines L1, L2, R1, R2 in FIG. 1 thus serve two functions: On one hand they form a multiplexer, together with the eight transistors T1 to T8, which can be used to alternatively select the left-hand or the right-hand bit line pair. On the other hand, in the second operating mode, they permit the lines in the respectively selected bit line pair to be interchanged in relation to the connections of the primary sense amplifier SA. Thus, the dual use of the eight transistors results in less complexity in terms of circuit elements and surface area, for implementing the multiplexer function and the switching function of the switching unit SW.

In the exemplary embodiment under consideration herein, the plate potential $V_P$ in FIG. 4 is at a level $V_{CC}/2$ in the two operating modes. That level is exactly between two supply potentials $V_{CC}$, ground for the memory in the two operating modes. In the second operating mode, the supply voltage for the memory is increased as compared with the first operating mode, so that the signals supplied by the sense amplifier SA to the bit line pair BLL, $\overline{BLL}$ also have a greater signal swing. Therefore, in the second operating mode, the voltages applied to the storage capacitor C in the memory cell MC are higher than in the first operating mode and constantly change their sign as a result of the changing of the switching state of the switching unit SW. In this way, aging in the memory cell is prevented.

Figure 2:
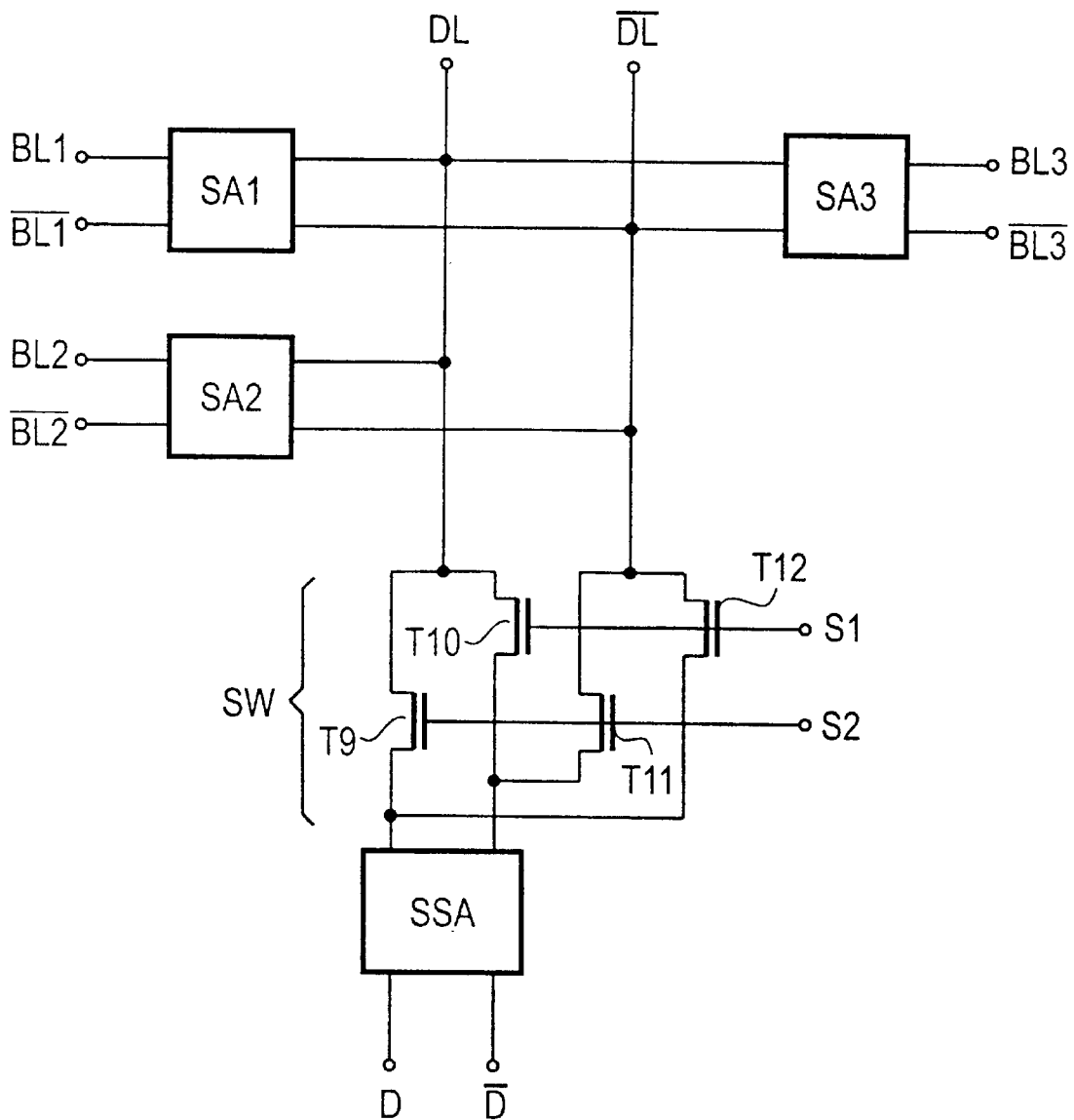
FIG. 2 is a schematic and block circuit diagram of a second exemplary embodiment of the memory according to the invention.

FIG. 2 shows a second exemplary embodiment of the invention. Three differential primary sense amplifiers SA1, SA2, SA3 are shown, which are each allocated to a respective bit line pair BL1, $\overline{BL1}$, BL2, $\overline{BL2}$ and BL3, $\overline{BL3}$. The primary sense amplifiers SAi (wherein i=1, 2, 3) are connected to a common data line pair DL, $\overline{DL}$ which is in turn connected through a differential secondary sense amplifier SSA to an external data line pair D, $\overline{D}$. During a read access operation to a memory cell associated with the first bit line pair BL1, $\overline{BL1}$, an appropriate differential signal is produced on the bit line pair and passed on, having been amplified by the primary sense amplifier SA1, to the data line pair DL, $\overline{DL}$. The secondary sense amplifier SSA amplifies the differential signal further and then passes it on to the external data line pair D, $\overline{D}$. In this exemplary embodiment, the memory has a switching unit SW which is used to interchange the lines in the data line pair DL, $\overline{DL}$ in relation to the connections of the secondary sense amplifier SSA. The noninverted data line DL is connected to a first connection of the secondary sense amplifier SSA through a ninth transistor T9 and to a second connection of the secondary sense amplifier through a tenth transistor T10. The inverted data line $\overline{DL}$ is connected to the second connection of the secondary sense amplifier SSA through an eleventh transistor T11 and to the first connection of the secondary sense amplifier SSA through a twelfth transistor T12. The gates of the tenth and the twelfth transistors T10, T12 are connected to a first control line S1, and the gates of the ninth and the eleventh transistors T9, T11 are connected to a second control line S2. The switching unit SW in FIG. 2 is driven through the control lines S1, S2 in the same manner as the switching units SW in FIG. 1 are driven through the control lines L1, L2 and R1, R2, respectively.

The secondary sense amplifier SSA in FIG. 2 is a differential sense amplifier which temporarily stores information read from the memory cells MC and information to be written to them, in the same way as the primary sense amplifiers SA, SAi in FIGS. 1 and 2. The secondary sense amplifier SSA can be constructed in the same way as the primary sense amplifiers. Whereas, in the exemplary embodiment of FIG. 1, each bit line pair BLL, $\overline{BLL}$ and BLR, $\overline{BLR}$ requires a switching unit SW to refresh the memory cells connected to it, in the exemplary embodiment shown in FIG. 2, only one switching unit SW is required for all of the bit line pairs BLi, $\overline{BLi}$ connected to the secondary sense amplifier SSA through their associated primary sense amplifiers SAi. This reduces the hardware complexity as compared with the exemplary embodiment shown in FIG. 1. In addition, on one hand, the exemplary embodiment shown in FIG. 2 has the advantage that secondary sense amplifiers can usually be disposed where there is still sufficient space for additional components such as the switching unit SW. On the other hand, primary sense amplifiers are disposed as close as possible to the memory cells MC having information which they are intended to amplify. Primary sense amplifiers are therefore usually disposed directly in or at the edge of a cell array, where it is difficult to accommodate additional circuit components such as those for the switching units SW.

In the exemplary embodiments illustrated herein, aging in the memory cells MC is prevented, or refreshing takes place, only in the second operating mode of the memory. In this case, aging is prevented whenever a particular number of write access operations have been performed. The memory contains an appropriate counter in order to record the write access operations. When a particular counter reading is reached, all of the memory cells MC in the memory are refreshed by the information stored in them being read, temporarily stored and written back to the memory cell at alternating levels. For this reason, the number of changes in the switching state of the switching units SW is even in these exemplary embodiments, so that, when refreshing has finished, the information which was originally stored in the memory cell is written back again.

We claim:

1. An integrated memory, comprising:

a cell array having bit lines and word lines;

writable memory cells disposed in said cell array;

a data line pair;

a first differential sense amplifier having connections connected to said data line pair, said first differential sense amplifier reading information from one of said memory cells over said data line pair during a read access operation in order to amplify the information subsequently, and said first sense amplifier writing information to one of said memory cells over said data line pair during a write access operation, said data line pair transferring the information as differential signals, and said first sense amplifier temporarily storing the information during every write access operation;

a switching unit having a switching state, said switching unit connecting said data line pair to said connections of said first sense amplifier, for interchanging lines of said data line pair in relation to said connections of said first sense amplifier depending on said switching state of said switching unit; and said switching state of said switching unit changing at least once during said write access operation, so that the information to be written is written to a relevant one of said memory cells by said first sense amplifier initially in noninverted form and then in inverted form.

2. The integrated memory according to claim 1, wherein said switching state of said switching unit does not change during said write access operation in a first operating mode, and said switching state of said switching unit changes at least once during said write access operation in a second operating mode.

3. The integrated memory according to claim 1, wherein said data line pair is formed from a pair of said bit lines, and said first sense amplifier is a primary sense amplifier connected directly to said bit line pair.

4. The integrated memory according to claim 1, wherein:
   said first sense amplifier is a secondary sense amplifier; and
   at least two second sense amplifiers are primary sense amplifiers, said primary sense amplifiers are connected through at least one respective pair of said bit lines to said memory cells, and said primary sense amplifiers are connected through said data line pair to said first sense amplifier.

5. The integrated memory according to claim 2, wherein said memory cells have a storage capability decreasing as a function of a number of at least one of write and read access operations being performed, said first operating mode is a normal operating mode and said second operating mode is an operating mode preventing aging.

6. The integrated memory according to claim 5, wherein said memory cells are ferroelectric memory cells.

7. The integrated memory according to claim 6, wherein:
   said memory cells have a ferroelectric storage capacitor for storing information; and
   a voltage drop across said storage capacitor during said write access operation to a respective one of said memory cells is higher in said second operating mode than in said first operating mode.

8. A method for preventing aging in a memory cell of an integrated memory according to claim 1, which comprises:
   reading and temporarily storing information stored in said memory cell in said first sense amplifier;
   writing the information temporarily stored in said sense amplifier back to said memory cell at least twice; and
   changing said switching state of said switching unit after each time the information is written back.

* * * * *